United States Patent [19]
Fukui et al.

[11] Patent Number: 5,747,111
[45] Date of Patent: May 5, 1998

[54] STEEL SHEET COATED WITH ZN-MG BINARY COATING LAYER EXCELLENT IN CORROSION RESISTANCE AND MANUFACTURING METHOD THEREOF

[75] Inventors: Yasushi Fukui; Masanori Matsuno; Hiroshi Tanaka; Tadaaki Miono; Kazushi Sakamoto; Yasumi Ariyoshi; Minoru Saito, all of Sakai, Japan

[73] Assignee: Nisshin Steel Co., Ltd., Tokyo, Japan

[21] Appl. No.: 787,260

[22] Filed: Jan. 24, 1997

Related U.S. Application Data

[62] Division of Ser. No. 607,703, Feb. 27, 1996, Pat. No. 5,648,177.

[30] Foreign Application Priority Data

Feb. 28, 1995 [JP] Japan ......................... 7-65096
Oct. 18, 1995 [JP] Japan ......................... 7-294736

[51] Int. Cl.[6] ............................. C23C 14/56; C21D 9/50
[52] U.S. Cl. ............................. 427/250; 427/251
[58] Field of Search ......................... 427/250, 251

[56] References Cited

FOREIGN PATENT DOCUMENTS

| 0175640 | 3/1986 | European Pat. Off. |
| 2217627 | 4/1972 | Germany . |
| 08081761 | 3/1996 | Japan . |
| 08134632 | 5/1996 | Japan . |

OTHER PUBLICATIONS

Extended Abstract—"Effect of Coating Structure on Corrosion Resistance of ZN-MG Alloy Vapor Deposited Steel Sheets", vol. 93/1, Jan. 1, 1993, pp. 1948–1949.

*Primary Examiner*—Sam Silverberg
*Attorney, Agent, or Firm*—Webb Ziesenheim Bruening Logsdon Orkin & Hanson, P.C.

[57] ABSTRACT

A Zn-Mg binary coating layer formed on a steel sheet has the tri-layered structure that the first sublayer composed of a Zn-Mg alloy having Mg concentration of 0.5 wt. % or less, the second sublayer composed of a Zn-Mg alloy having Mg concentration of 7 wt. % or more and the third sublayer composed of a Zn-Mg alloy having Mg concentration of 0.5 wt. % or less are successively laminated. The coating layer may have the penta-layered structure wherein sublayers composed of a Zn-Mg alloy having Mg concentration of 2–7 wt. % are additionally interposed between the high-Mg and low-Mg sublayers. A Zn-Fe or Zn-Fe-Mg alloy layer may be formed at the boundary between the substrate steel and the coating layer. The adhesion ratio of the first sublayer to the top sublayer is preferably 1.2 or more, while the high-Mg sublayer is preferably conditioned to the mixed structure of a $Zn_2Mg$ phase with a Mg-dissolved Zn phase. Due to the specified lamellar structure, the intrinsic properties of the high-Mg sublayer is sufficiently exhibited, and the secondary paint adhesiveness of the coating layer is excellent. Consequently, the coated steel sheet is useful as structural members or parts exposed to a severe corrosive atmosphere in various industrial fields.

7 Claims, 4 Drawing Sheets

FIG.3

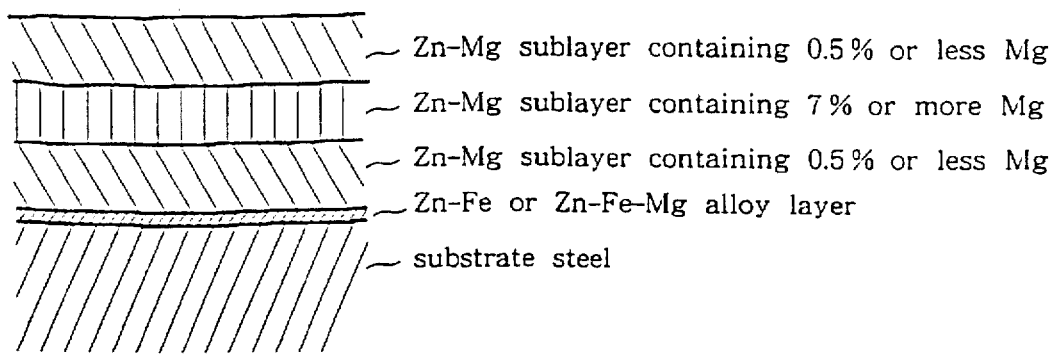

- Zn-Mg sublayer containing 0.5% or less Mg
- Zn-Mg sublayer containing 7% or more Mg
- Zn-Mg sublayer containing 0.5% or less Mg
- Zn-Fe or Zn-Fe-Mg alloy layer
- substrate steel

FIG.4

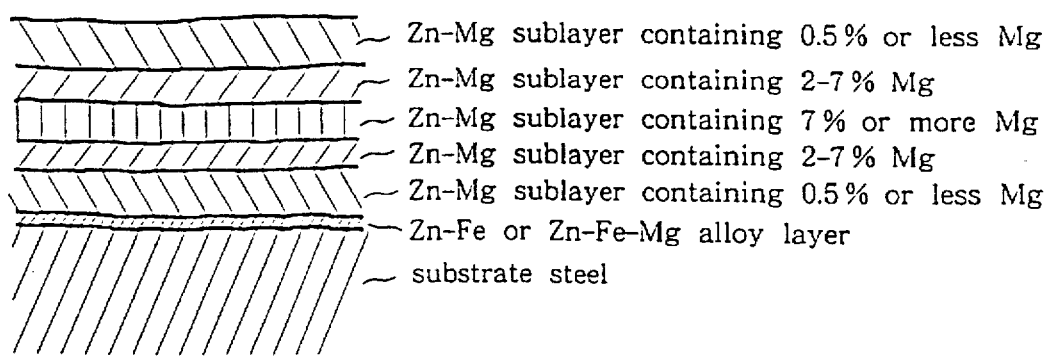

- Zn-Mg sublayer containing 0.5% or less Mg
- Zn-Mg sublayer containing 2-7% Mg
- Zn-Mg sublayer containing 7% or more Mg
- Zn-Mg sublayer containing 2-7% Mg
- Zn-Mg sublayer containing 0.5% or less Mg
- Zn-Fe or Zn-Fe-Mg alloy layer
- substrate steel

FIG.5

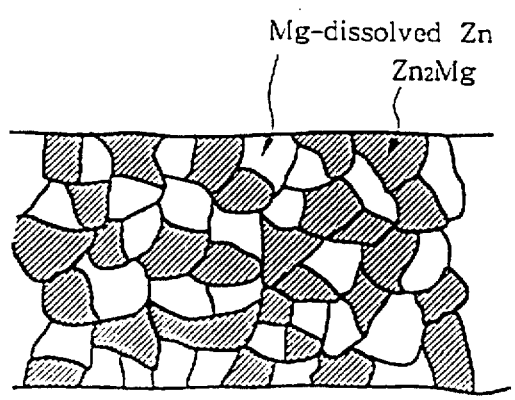

Mg-dissolved Zn
$Zn_2Mg$

STEEL SHEET COATED WITH ZN-MG BINARY COATING LAYER EXCELLENT IN CORROSION RESISTANCE AND MANUFACTURING METHOD THEREOF

This is a divisional of application Ser. No. 08/607,703 filed on Feb. 27, 1996 now U.S. Pat. No. 5,648,177.

BACKGROUND OF THE INVENTION

The present invention relates to a steel sheet coating with a Zn-Mg binary coating layer excellent in corrosion resistance, anti-powdering, adhesiveness, spot weldability, anti-discoloring and water-proof secondary paint adhesiveness. The present invention is also concerned with a method of manufacturing said Zn-Mg alloy coated steel sheet by vacuum deposition process.

Various finishing methods have been developed so far in order to improve the corrosion resistance of a steel sheet. A representative method is Zn plating. Zn plating is performed by electroplating or hot-dip coating. A demand for corrosion resistant material having higher properties becomes stronger year by year, in response to the pollution of the atmosphere. In this regard, various improvements have been proposed in electroplating and hot-dip coating.

In order to improve the corrosion resistance of a Zn-coated steel sheet manufactured by hot-dip coating process, what is thought at first is the increase of the adhesion amount of a Zn layer. However, there is a limitation on the increase of the adhesion amount due to operational conditions, so that corrosion resistance is improved to a limited extent by the increase of the adhesion amount. On the other hand, the increase of the adhesion amount, i.e. making a plating layer thicker, is likely to cause defects such as scuffing and flaking during press-working the coated steel sheet.

In order to form a coating layer with high adhesion amount by electroplating process, a line speed is necessarily determined lower, or electrolytic cells are obligatorily increased in number. Consequently, productivity is significantly reduced.

The corrosion resistance can be improved by depositing a Zn alloy such as a Zn-Ni alloy. However, since the Zn-Ni alloy layer is hard and fragile, defects such as cracking or chipping are likely to be formed in the coating layer during working the coated steel. When these defects are formed in the coating layer, the substrate steel is exposed to the atmosphere through the defects. Consequently, the property of the coating layer itself is not exhibited well, and the defects acts as the starting points to develop corrosion.

A vapor deposition process is highlighted as the method to overcome the abovementioned problems in the hot-dip coating or electroplating process. Especially, a Zn-Mg alloy-coated steel sheet is expected as superior corrosion resistant material.

For instance, Japanese Patent Application Laid-Open 64-17853 discloses the formation of a Zn-Mg alloy coating layer containing 0.5–40 wt. % Mg and the coating layer mainly composed of Zn-Mg intermetallic compounds effective in affinity to paint. Japanese Patent Application Laid-Open 2-141588 discloses the improvement of the Zn-Mg alloy coating layer in adhesiveness and workability by the formation of an intermediate layer such as Zn, Ni, Cu, Mg, Al, Fe, Co or Ti between the coating layer and the substrate steel. Japanese Patent Application Laid-Open 64-25990 discloses the provision of a Zn-Ti alloy layer on a Zn-Mg alloy coating layer to improve corrosion resistance after painting.

A vapor deposition Zn-coated steel sheet is continuously manufactured by reductively heating a steel sheet in the same unoxidizing and reducing furnaces as those in a conventional hot-dip process and then vapor depositing one or more coating metals, as disclosed in Nisshin Tech. Review No.56 (1987). p. 41. When the steel sheet is heated in the nonoxidizing furnace, oils remaining on the surface of the steel sheet are burnt and removed from the surface. The steel sheet is then annealed in the reducing furnace held in a gas atmosphere such as $H_2$-$N_2$ or $H_2$, so that oxide films are decomposed and separated from the surface of the steel sheet. The steel sheet having the surface activated in this way is cooled in a reducing atmosphere and carried through a duct held in a $N_2$ atmosphere and vacuum sealing means into a vacuum chamber. In the vacuum chamber, Zn is vapor deposited on the steel sheet, and the steel sheet is carried out through outlet vacuum sealing means.

Since the aforementioned process for manufacturing vapor deposition Zn-coated steel sheets passes through the same pretreatment step as that in a conventional hot-dip coating process, a vapor deposition coating process can be performed using a part of existing equipment. The equipment including the vapor deposition step may be applied to the production of a Zn-Mg alloy coated steel sheet excellent in corrosion resistance. A degreasing-cleaning cell may be used instead of the unoxidizing furnace. The vapor deposition Zn coating method has the same or higher efficiency compared with a Zn electroplating process.

A steel sheet coated with a Zn-Mg alloy layer in big adhesion amount has the defect that powdering is likely to form during press working the coated sheet sheet. Said powdering is accelerated, when the rate of Zn-Mg intermetallic compounds in the coating layer is bigger as the increase of Mg concentration, or when there are intermetallic compounds near the boundary between the coating layer and substrate steel even if Mg concentration is lower. The powdering is caused by hard and fragile Zn-Mg intermetallic compounds which can not follow the deformation of the substrate steel having high ductility and forms interlayer splitting or cracking in the end.

The powdering may be eliminated by the decrease of Mg concentration for reducing intermetallic compounds in the coating layer and for enhancing the ductility of the coating layer. However, the decrease of Mg concentration deteriorates the corrosion inhibiting power of the coating layer. Although the powdering can be suppressed by increasing Mg concentration only at the top layer, the Mg-enriched surface is colored black resulting in the reduction of commercial value. Besides, the high Mg concentration at the surface of the coating layer accelerates the diffusion of Mg to a welding electrode during spot welding, so that the coated steel sheet shows poor weldability.

When a Zn-Mg alloy coated steel sheet is manufactured by depositing Mg and then Zn, and heating the deposition layer to promote mutual diffusion between Mg and Zn, the steel sheet is heated in the reducing atmosphere to remove oxide films from the surface. However, when the steel sheet having the surface activated is carried through a duct held in a $N_2$ atmosphere, the surface is contaminated and re-oxidized by $O_2$ and $H_2O$ slightly remaining in the $N_2$ atmosphere. The formed oxide films react with Mg, Fe and Zn and form brittle reaction products. Consequently, the coating layer formed on the substrate steel sometimes shows poor adhesiveness.

When vapor deposition is performed on a steel sheet held at a relatively lower temperature, vacancies are likely to be formed in the coating layer. The resultant coating layer is not dense, and the substrate steel is exposed to a corrosive atmosphere through the porous coating layer. Consequently, the coating layer does not exhibit its corrosion inhibiting effect well.

The Zn-Mg alloy coating layer, different from a coating layer formed by conventional hot-dip coating or electroplating process, remarkably changes its properties in response to its lamellar structure. A steel sheet coated with a Zn-Mg binary coating layer having the laminated structure that a high-Mg sublayer formed at the middle is sandwiched with low-Mg sublayers sometimes shows poor water-proof secondary paint adhesiveness. For instance, the effective adhesiveness of paint film is not obtained as the result of the test that the coated steel sheet after being painted is dipped in warm water of 50° C. for a long time. Merely the corrosion resistance can be improved by locating the high-Mg sublayer at the top without the formation of the low-Mg sublayer at the top. However, the high-Mg sublayer existing at the top of the coating layer deteriorates the water-proof secondary paint adhesiveness, but also promotes discoloration due to dump.

SUMMARY OF THE INVENTION

The present invention is accomplished to overcome the defects as above-mentioned.

The first object of the present invention is to provide a steel sheet coated with a Zn-Mg binary coating layer excellent in corrosion resistance, anti-powdering, adhesiveness, spot weldability and anti-discoloring by reforming the coating layer to a multi-layered structure having specified composition while suppressing defects originated in high Mg concentration.

The second object of the present invention is to provide a steel sheet coated with a Zn-Mg binary coating layer well balanced between water-proof secondary paint adhesiveness and corrosion resistance by controlling the adhesion amount of a low-Mg sublayer to be formed at the top.

The third object of the present invention is to provide a steel sheet coated with a Zn-Mg binary coating layer excellent in corrosion resistance which effectively suppresses the formation of rust even at cut end face by conditioning the high-Mg sublayer to specified mixed structure.

The fourth object of the present invention is to provide a steel sheet coated with a dense Zn-Mg binary coating layer excellent in corrosion resistance and adhesiveness by vapor depositing Zn and then Mg.

A steel sheet coated with a Zn-Mg binary coating layer according to the present invention has the basic structure that the first sublayer composed of a Zn-Mg alloy containing 0.5 wt. % or less Mg, the second sublayer composed of a Zn-Mg alloy containing 7 wt. % or more Mg, and the third sublayer composed of a Zn-Mg alloy containing 0.5 wt. % or less Mg are successively laminated on the surface of substrate steel. In the case when much higher corrosion resistance is requested, the coating layer may be adjusted to the penta-layered structure instead of said tri-layered structure. The penta-layered structure has additional sublayers composed of a Zn-Mg alloy containing 2-7 wt. % Mg and located between the high-Mg sublayer and the low-Mg sublayers in the tri-layered structure.

Mg concentration in the high-Mg sublayer is preferably up to 20 wt. %, in order to assure corrosion resistance in a humid atmosphere. The corrosion resistance of the coated steel sheet is effectively enhanced, when the high-Mg sublayer has the mixed structure of a $Zn_2Mg$ phase with a Mg-dissolved Zn phase. The middle-Mg sublayer may be conditioned to the mixed structure of a $Zn_{11}Mg_2$ phase with a Mg-dissolved Zn phase. When the top sublayer composed of the low-Mg alloy is formed in an adhesion amount of 0.3 g/m² or more, the coated steel sheet is improved in waterproof secondary paint adhesiveness. The high-Mg sublayer effective in the improvement of corrosion resistance may be located at a higher position in the coating layer, by controlling the adhesion ratio of the first sublayer to the top sublayer above 1.2.

When vapor deposition is performed in an atmosphere containing $O_2$ or $H_2O$, the surface of a steel sheet would be oxidized. When vapor deposition is not performed immediately after the activation of the steel sheet, the surface of the steel sheet would be contaminated. Such oxidation or contamination reduces the adhesiveness of a coating layer onto the substrate steel. In these cases, a Zn-Fe or Zn-Fe-Mg alloy layer is formed at the boundary between the coating layer and the substrate steel in order to improve the adhesiveness of the coating layer. The Zn-Fe or Zn-Fe-Mg alloy layer is preferably of 0.5 μm or less in thickness to inhibit the powdering of the coating layer during working. Fe concentration in the Zn-Fe or Zn-Fe-Mg alloy layer is preferably 6 wt. % or more.

The steel sheet coated with a Zn-Mg binary coating layer is preferably manufactured by predepositing Zn under the condition that the adhesion ratio of Zn to Mg is 1.5 or more per unit surface area, and then depositing Mg and Zn. The steel sheet is preferably held at a temperature above 180° C. during the deposition of Zn and Mg. The Zn-Mg binary coating layer having the specified lamellar structure may be obtained by simultaneously depositing Zn and Mg while changing the deposition ratio of Zn to Mg.

The temperature of a steel sheet at the completion of vapor deposition is an important factor to promote mutual diffusion between deposited Zn and Mg by a heat retained in the steel sheet. Said temperature can be controlled by adjusting the temperature of the steel sheet before vapor deposition. When Zn, Mg and then Zn are independently and successively vapor deposited on the steel sheet temperature-controlled so as to be held at 270°–370° C. at the completion of vapor deposition, the effective multi-layered structure and the specified mixed structure are formed. A Zn-Mg binary coating layer having the specified structure may be formed by holding the steel sheet 1 hr. or longer at 150°–250° C. after the successive deposition of Zn, Mg and Zn. The heating in this case is performed in an inert gas atmosphere such as $N_2$ or Ar in order to inhibit the oxidation of the steel sheet.

The steel sheet to be coated is carried through the reductively heating zone to activate the surface of the steel sheet, a duct held in a $N_2$ atmosphere and vacuum sealing means into a vacuum chamber. In the vacuum chamber, Zn, Mg and then Zn are successively vapor deposited on the steel sheet, and the deposited Zn and Mg are mutually diffused to form a Zn-Mg binary coating layer. In this case, the steel sheet is preferably passed through the duct under the condition satisfying the relationships of X×Z≦1.2 and Y×Z≦35, wherein X represents $O_2$ concentration (vol. %) in the duct, Y represents $H_2O$ concentration (vol. %) in the duct, and Z represents the passing time (sec.) of the steel sheet through the duct.

$H_2$ may be added in an amount of 0.05–4 vol. % to the atmosphere in the duct. In this case, the steel sheet may be passed through the duct under the relaxed condition satisfying the relationships of X×Z≦3.8 and Y×Z≦80.

There is ordinarily an oxidized Mg-enriched layer on the surface of the Zn-Mg binary coating layer formed by the vapor deposition process. The Mg-enriched layer is left as such for the use requiring initial corrosion resistance. The Mg-enriched layer is removed by acid pickling or the like for the use requiring spot weldability or detesting the blackening of the surface.

BRIEF DESCRIPTION OF THE DRAWINGS

FIG. 3 is the sectional view of a steel sheet coated with a Zn-Mg binary coating layer having tri-layered structure having a Zn-Fe or Zn-Fe-Mg alloy layer formed at the boundary.

FIG. 4 is the sectional view of a steel sheet coated with a Zn-Mg binary coating layer having penta-layered structure having a Zn-Fe or Zn-Fe-Mg alloy layer formed at the boundary.

FIG. 5 is a schematic view illustrating the mixed structure of a high-Mg sublayer.

DETAILED DESCRIPTION OF THE PREFERRED EMBODIMENTS

We have researched and examined the effect of the lamellar structure of a Zn-Mg binary coating layer on the properties of the coated steel sheet from various points of view. In the course of researching, we have found that the coated steel sheet is improved in anti-powdering, corrosion resistance, spot weldability, adhesiveness and anti-discoloring by forming a high-Mg sublayer at the middle of the coating layer and sandwiching said high-Mg sublayer between low-Mg sublayers.

Figure 1:
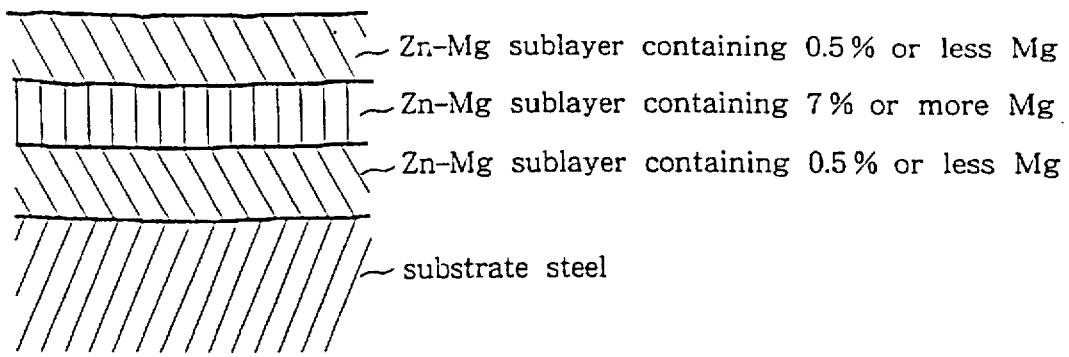
FIG. 1 is the sectional view of a steel sheet coated with a Zn-Mg binary coating layer having tri-layered structure according to the present invention.

The Zn-Mg binary coating layer according to the present invention has the tri-layered structure (as shown in FIG. 1) that a low-Mg sublayer as the first sublayer, a high-Mg sublayer as the second sublayer and another low-Mg sublayer as the third sublayer are successively laminated on the surface of substrate steel. The low-Mg sublayer having Mg concentration of 0.5 wt. % or less has relatively higher dissolution speed and serves as a sacrifice anode effective for inhibiting the formation of rust at the exposed surface part of the substrate steel such as scratched parts. Said low-Mg sublayer especially inhibits the formation of rust at the initial period. The high-Mg sublayer having Mg concentration of 7 wt. % or more (preferably 7-20 wt. %) has excellent corrosion preventing effect and prolongs the life of the coating layer itself until consumption by corrosion reaction. The element Mg dissolved from the high-Mg sublayer promotes the formation of corrosion products such as $ZnCl_2.4\ Zn(OH)_2$ and $Zn(OH)_2$ serving as corrosion inhibitors, so as to improve corrosion resistance.

Figure 2:
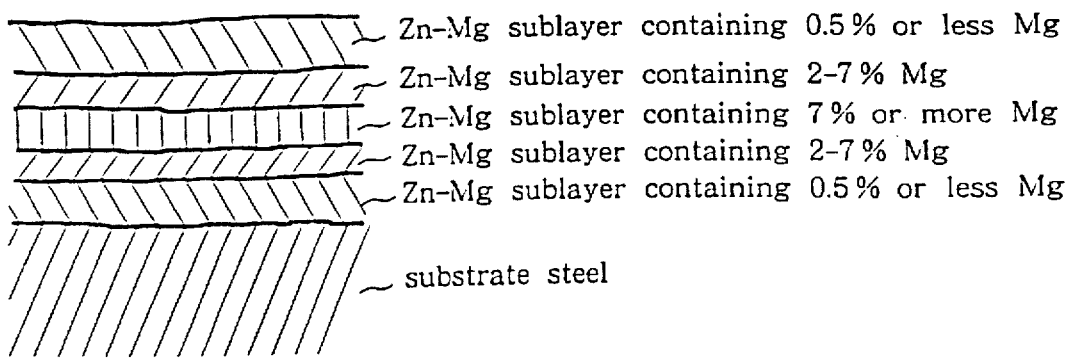
FIG. 2 is the sectional view of a steel sheet coated with a Zn-Mg binary coating layer having penta-layered structure according to the present invention.

The coating layer may have the penta-layered structure (as shown in FIG. 2) that middle-Mg sublayers having Mg concentration of 2-7 wt. % are formed between the high-Mg sublayer and the low-Mg sublayers, sublayers. The middle-Mg sublayer has intermediate properties between the high-Mg and low-Mg sublayers, and further improves the corrosion resistance. Consequently, the coated steel sheet exhibits the excellent corrosion resistance which has not been noted in known coated steels, due to the synergetic effects of the sublayers above-mentioned.

The high-Mg sublayer significantly reduces the adhesiveness of a paint film, when water or aqueous vapor invades to the boundary between the coating layer and the paint film. The water-proof secondary paint adhesiveness which is reduced by the high-Mg sublayer is recovered by the formation of the low-Mg sublayer having Mg concentration of 0.5 wt. % or less in an adhesion amount of 0.3 g/m² or more on the high-Mg sublayer.

If the top low-Mg sublayer is formed in an adhesion amount below 0.3 g/m², the parts of the high-Mg sublayer uncovered with the low-Mg sublayer remain as pin holes exposed to the atmosphere. The exposed parts of the high-Mg sublayer puts harmful influence on water-proof secondary paint adhesiveness. In addition, the high-Mg sublayer forms a thicker reaction layer than the low-Mg sublayer does, during chemical conversion or painting. The thicker reaction layer reduces the water-proof secondary paint adhesiveness, too. In this regard, the low-Mg sublayer to be formed at the top shall have Mg concentration of 0.5 wt. % or less and an adhesion amount of 0.3 g/m² or more, to improve water-proof secondary paint adhesiveness.

The corrosion preventing effect of the coating layer is guaranteed by contolling the adhesion ratio of the first low-Mg sublayer to the top low-Mg sublayer at 1.2 or more. The adhesion ratio of 1.2 or more means the location of the high-Mg sublayer effective in corrosion resistance at a higher position in the coating layer. If the adhesion ratio is below 1.2, the improvement of corrosion resistance is not noted regardless of the position of the high-Mg sublayer. Since the low-Mg sublayer having Mg concentration of 0.5 wt. % or less is ductile, it absorbs the difference in deformation between the high-Mg coating layer and the substrate steel during press working the coated steel sheet. Consequently, the low-Mg sublayer effectively inhibits powdering, too.

When the high-Mg sublayer having Mg concentration of 7-20 wt. % is conditioned to the mixed structure (as shown in FIG. 5) of a $Zn_2Mg$ phase with a Mg-dissolved Zn phase, excellent corrosion resistance is exhibited even at the sectional part of the coated steel, e.g. a cut end face, exposed to the outside. The effect of the mixed structure on the improvement of corrosion resistance is supposed as follows:

When the Zn-Mg alloy coated steel sheet is exposed to a corrosive atmosphere, the element Mg dissolves from the $Zn_2Mg$ phase which is at a basic potential by the electrochemical reaction between a Mg-dissolved Zn phase and the $Zn_2Mg$ phase. The dissolved Mg reacts with water and forms hydroxide effective in corrosion prevention. Since the cut end face is covered with the hydroxide, the cut end face is protected against corrosion. The effect of the controlled metallurgical structure of the coating layer on corrosion resistance, which is newly found out by the present invention, is the reason why the excellent corrosion resistance has not been noted in conventional coated steel sheets. On the contrary, a coating layer comprising intermetallic compounds such as $Zn_{11}Mg_2$, $Zn_2Mg$ and ZnMg, as disclosed in Japanese Patent Application Laid-Open 1-139755, does not generate big electric potential difference between $Zn_{11}Mg_2$ and $Zn_2Mg$. Consequently, electrochemical reaction is weak, the dissolution of Mg is dull, and the effect on corrosion prevention at the cut end face is inferior.

When the middle-Mg sublayer having Mg concentration of 2–7 wt. % to be formed as the second and fourth sublayers (shown in FIG. 2) is conditioned to the mixed structure of a $Zn_{11}Mg_2$ phase with a Mg-dissolved Zn phase, it is possible to continue the dissolution of Mg for a long time. In this case, since the $Zn_{11}Mg_2$ phase has lower Mg concentration than the $Zn_2Mg$ phase, electric potential difference generated between the Mg-dissolved Zn phase and the $Zn_{11}Mg_2$ phase is so small to lower the dissolution speed of Mg. Consequently, the dissolution of Mg is gradually continued, so as to assure the excellent corrosion inhibiting effect of the coating layer for a long period.

In short, the cut end face at the initial stage, which requires big corrosion inhibiting power due to the naked state, is prevented from corrosion by the high-Mg sublayer (i.e. the third sublayer shown in FIG. 2) having high dissolution speed of Mg and covered with magnesium hydroxide as a reaction product. After the face is covered with magnesium hydroxide, so big corrosion inhibiting power is not necessary. The corrosion inhibiting power of the second and fourth sublayers (shown in FIG. 2) is applied to the covered face. Therefore, the cut end face is protected from corrosion over a long time.

A Zn-Fe or Zn-Fe-Mg alloy layer is preferably formed at the boundary between the substrate steel and the first sublayer, as shown in FIGS. 3 and 4, to improve the adhesiveness of the coating layer. When the Zn-Mg binary coating layer is formed by vacuum deposition process in an atmosphere containing $O_2$ or $H_2O$, the adhesiveness of the coating layer is deteriorated due to the surface oxidation of the steel sheet. When vapor deposition is not performed immediately after surface activation, the adhesiveness of the coating layer is deteriorated by the contamination of the surface, too. Such the deterioration of adhesiveness is inhibited by the formation of the Zn-Fe or Zn-Fe-Mg alloy layer at the boundary. The Zn-Fe or Zn-Fe-Mg alloy layer preferably of 0.5 μm or less in thickness: otherwise powdering would be formed during working the coated steel sheet. Fe concentration in the Zn-Fe or Zn-Fe-Mg alloy layer is preferably 6 wt. % or more.

When a steel sheet after being coated is acid pickled to remove an oxidized Mg-enriched layer, the surface of the coating layer which will come in contact with a welding electrode during spot welding is conditioned to a low-Mg state having Mg concentration of 0.5 wt. % or less. The low-Mg state reduces the diffusion of Mg to the welding electrode and effectively improves spot weldability. If Mg remains in a large amount on the surface of the coating layer, the surface of the coating layer would be colored black due to the state unsaturated with zinc oxide and hydroxide. The blackening is inhibited by controlling Mg concentration on the surface at 0.5 wt. % or less, too.

According to the present invention, Zn is vapor predeposited on the steel sheet before Mg deposition. The predeposited Zn firmly adheres onto the surface of the steel sheet even which has thin oxide films thereon, so that Mg and Zn depostion layers in the following steps are formed on the substrate steel with good adhesiveness. However, when it takes a few seconds or longer from Mg deposition to Zn deposition, or when vapor deposition is performed on a steel sheet held at a temperature of 180° C. or higher to improve the adhesiveness of the coating layer, too thin primary Zn deposition permits the diffusion of Mg in a large amount to the boundary between the coating layer and the substrate steel and causes the formation of a brittle intermediate layer. The similar brittle intermediate layer would be formed by the diffusion of Mg to the Zn predeposition layer during the heat treatment of the coating layer.

The formation of the brittle intermediate layer is inhibited by controlling the adhesion ratio of the primary Zn deposition layer to the Mg deposition layer at 1.5 or more. The primary Zn deposition layer in the controlled adhesion amount suppresses the diffusion of Mg to the boundary between the coating layer and the substrate steel, when deposition is performed on the steel sheet held at 180° C. or higher or when the coating layer is subjected to thermal diffusion treatment. Even if Mg is diffused, the diffusion of Mg is controlled at a lower level. Consequently, the brittle intermediate layer is not formed, and the adhesiveness of the Zn-Mg binary coating layer to the substrate steel is enhanced.

When the temperature of the steel sheet is adjusted at 270°–370° C. at the completion of vapor deposition, the diffusion reaction between Zn and Mg is autogeneously promoted by a heat retained in the steel sheet, so as to form the Zn-Mg binary coating layer having the tri-layered structure (shown in FIG. 1) or the penta-layered structure (shown in FIG. 2). If the temperature of the steel sheet does not reach 270° C. Mg partially remains as such without diffusion. The remaining Mg causes poor corrosion resistance. If the temperature of the steel sheet exceeds 370° C. the coating layer is changed to the state that Zn-Mg intermetallic compounds and a Mg-dissolved Zn phase are dispersed over the whole of the coating layer, resulting in poor paint adhesiveness and the blackening of the coating layer. The higher temperature of the steel sheet above 370° C. causes the excessive growth of the Zn-Fe or Zn-Fe-Mg alloy layer exceeding 0.5 μm in thickness. Due to the thick Zn-Fe or Zn-Fe-Mg alloy layer, cracking or peeling would be formed in the coating layer during press working the coated steel sheet. The heating temperature is preferably determined at 150°–240° C. by the same reason, when the coating layer is heat treated for the diffusion of Zn and Mg after the completion of vapor deposition.

When a steel sheet to be coated is passed through a duct held in a $N_2$ atmosphere, oxide films which are formed on the surface of the steel sheet by re-oxidation is prevented from thickening by satisfying the conditions of $X \times Z \leq 1.2$ and $Y \times Z \leq 35$, wherein X represents $O_2$ concentration (vol. %) in the $N_2$ atmosphere, Y represents $H_2O$ concentration (vol. %) in the $N_2$ atmosphere, and Z represents the passing time of the steel sheet through the duct. Consequently, the adhesiveness of the primary Zn deposition layer onto the substrate steel is assured. When $H_2$ in a small amount is added to the $N_2$ atmosphere, the restrictions on the atmosphere in the duct and the passing time are relaxed so as to facilitate the production of the coated steel sheet.

Figure 6:
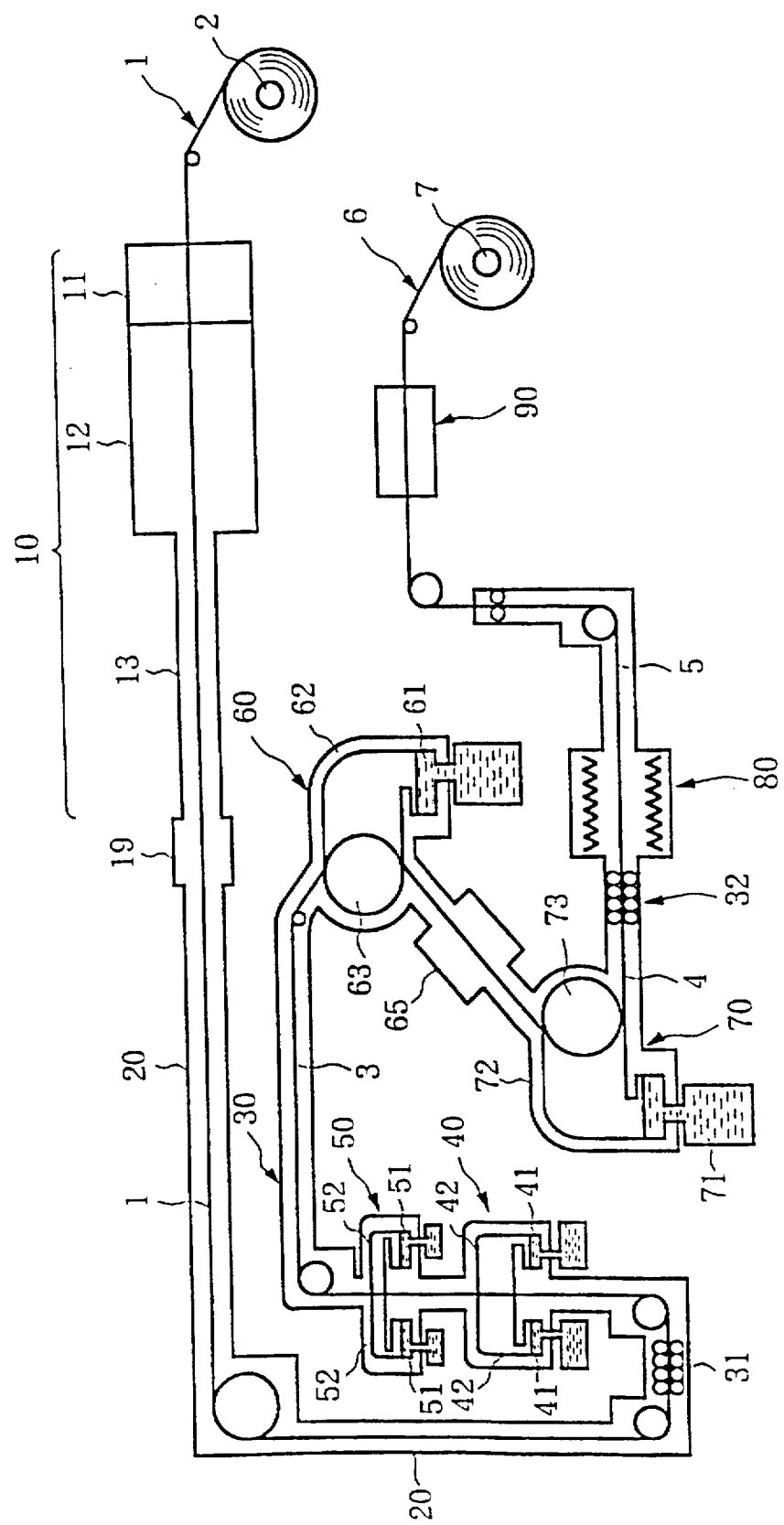
FIG. 6 is a schematic view illustrating a plant for manufacturing a Zn-Mg alloy coated steel sheet.

The coated steel sheet according to the present invention is manufactured by a plant schematically shown in FIG. 6.

A parent steel sheet 1 is uncoiled from a pay-off reel 2, carried through a pretreating zone 10 comprising an unoxidizing furnace 11, a reductively annealing furnace 12 and a cooling zone 13 held in a reducing atmosphere, and then introduced through a chamber 19 whose atmosphere is replaced by $N_2$ and a duct 20 held in a $N_2$ atmosphere into a vacuum vapor deposition chamber 30. In the reductively annealing furnace 12, the parent sheet 1 is heated and annealed in a reducing atmosphere having the composition of 50% $H_2$-$N_2$ to remove oxide films from the surface.

The vacuum chamber 30 is hermetically sealed by inlet sealing rolls 31 and outlet sealing rolls 32. The interior of the vacuum chamber 30 is evacuated to the degree of vacuum of $1 \times 10^{-2}$ torr. by a vacuum pump (not shown). A primary Zn deposition compartment 40, a Mg deposition compartment 50, the first Zn deposition compartment 60 and the second Zn deposition compartment 70 are sequentially arranged along the pass line of the parent steel sheet 1 in the vacuum chamber 30. A subsidiary Zn deposition compartment 65 may be occasionally located between the first Zn deposition compartment 60 and the second Zn deposition compartment 70.

Vapor Mg deposition may be performed using a heat source such as electric resistance heating, high-frequency heating, electron beam heating or arc heating. In the illustrated plant, Mg evaporation sources 51 and guide hoods 52 for introducing Mg vapor are located at the positions facing to both surfaces of the parent sheet 1. Either one or both of the Mg evaporation sources 51 are operated in response to single or double-face coating.

The Zn deposition compartments 40, 60, 70 have Zn vapor generators 41, 61, 71 and guide hoods 42, 62, 72 faced to the parent steel sheet 1 or the steel sheet 3 to which Mg has been vapor deposited. The guide hoods 42 in the primary Zn deposition compartment 40 are located at the positions faced to the both surfaces of the parent steel sheet 1, so as to form primary Zn deposition layers on both surfaces of the steel sheet at the same time. In the first Zn deposition compartment 60 or the second Zn deposition compartment, the steel sheet 3 is wound around a winding roll 63 or 73, and the single surface of the steel sheet 3 is subjected to vapor deposition.

The steel sheet 4 after being coated with Zn vapor deposition layer is carried through the outlet sealing rolls 32 into a heating furnace 80. The coated steel sheet 4 is occasionally heat treated, by proper heating means such as a high-frequency heater in a heating furnace 80. The heated steel sheet 5 is passed through a post treatment zone 90, wherein chemical conversion treatment or the like is applied to the steel sheet 5. The steel sheet is finally coiled as a coated steel sheet 6 around a coiling reel 7. When the steel sheet is not heat treated in the heating furnace 80, the coated steel sheet 4 may be batch heated in an independent heating furnace.

The coated steel sheet manufactured in this way has a Zn-Mg binary coating layer or layers on either one or both surfaces according to the demands. For instance, when the Zn-Mg binary coating layer is formed on the single surface of the steel sheet, one of the Mg evaporation sources 51 and one of the Zn vapor generators 61 or 71 are driven.

EXAMPLES

Example 1
Steps of Manufacturing Coated Steel Sheet

A steel sheet of 0.8 mm in thickness having the composition of 0.002 wt. % C, 0.02 wt. % Si, 0.21 wt. % Mn, 0.007 wt. % P, 0.001 wt. % S, 0.076 wt. % Ti, 0.031 wt. % Al and the balance being Fe was used as a parent sheet. This parent sheet was reductively heated in the gas atmosphere of $N_2$-50% $H_2$ to remove oxide films from the surface, and then fed into the vacuum chamber which had been evacuated by a vacuum pump and kept at the $N_2$ partial pressure of $5 \times 10^{-2}$ torr, by supplying $N_2$ gas having a dew point of $-60°$ C.

In the vacuum chamber, the vapor deposition was performed in the order of Zn→Mg→Zn under the conditions that an adhesion amount in total was predetermined at 100 g/m² and that the deposition of primary Zn was controlled at the same adhesion amount as that of the secondary Zn deposition.

In the case of manufacturing a coated steel sheet having a Zn-Fe or Zn-Fe-Mg alloy layer formed between substrate steel and the coating layer having the tri-layered structure (shown in FIG. 3) or the penta-layered structure (shown in FIG. 4), the vapor deposition in the order of Zn→Mg→Zn was performed on the parent sheet held at 200° C., the parent sheet was heated 5–10 seconds in the vacuum chamber filled with $N_2$ gas at 700 torr. The heating temperature was determined at 270°–300° C. for forming the tri-layered structure, or at 330°–370° C. for forming the penta-layered structure. The Zn-Fe or Zn-Fe-Mg alloy layer grew up to approximately 0.2 μm in thickness by the heat treatment. The obtained coating layer had the multi-layered structure that a high-Mg sublayer near the middle part of the coating layer had Mg concentration of approximately 10 wt. %, while low-Mg sublayers on and under said high-Mg sublayer had Mg concentration of 0.5 wt. % or less. Middle-Mg sublayers in the penta-layered structure had Mg concentration of approximately 4 wt. %.

On the other hand, Zn and Mg were vapor deposited while variously changing their deposition ratio, so as to form Zn-Mg binary coating layers having the multi-layered structure shown in FIGS. 1 and 2 with an adhesion amount of 100 g/m² per single face. In this case, the concentration of each sublayer was adjusted to the same value as the sublayers afore-mentioned (shown in FIGS. 3 and 4). The parent sheet was held at 120° C. during vapor deposition, but not heat treated after the vapor deposition.

Each coated steel sheet was acid pickled in a 0.5% HCl aqueous solution to remove Mg-rich layers from the surface. The coated steel sheet after the acid pickling was sufficiently washed with water. When the coated steel sheets obtained in this were observed, the coating layers having multi-layered structures shown in Table 1 were detected.

Research for Properties of Coating Layers

Each coated steel sheet was examined to research the properties of the coating layer. Corrosion resistance was evaluated by a time period until the formation of rust in the salt water spray test regulated under JIS Z2371. Anti-powdering was evaluated by the degree of powdering in the draw bead test wherein a test piece was clamped with dies to which beads of 4 mm in height with a radius of 0.5 mm were formed, and the test piece was drawn from the dies at a drawing speed of 200 m/min. with a pressure of 500 kgf. Spot weldability was evaluated by the number of spots capable of continuous welding under the condition using a type-CF electrode made of a Cu-1% Cr alloy and having a top of 4.5 mm in diameter attached to a single-phase A.C. welder. Anti-blackening was evaluated by the difference ΔL* of brightness between before and after the test wherein a testpiece was held alone 1000 hrs. in an accelerated discoloring device at 50° C. and relative humidity of 60%.

It is noted from Table 1 that each steel sheet coated with the coating layer having the tri-layered or penta-layered structure according to the present invention is excellent in all of corrosion resistance, anti-powdering, spot weldability and anti-blackening. In addition, the coating layer having the Zn-Fe or Zn-Fe-Mg layer at the boundary (as shown in FIG. 3 or 4) exhibited excellent adhesiveness, even when vapor deposition was performed in an oxidizing atmosphere containing $H_2O$ or $O_2$ in an amount of several tens p.p.m.

TABLE 1

PROPERTIES OF COATING LAYERS IN RELATION WITH MULTI-LAYERED STRUCTURE (THE PRESENT INVENTION)

| MULTI-LAYERED STRUCTURE OF COATING LAYER | TRI-LAYERED STRUCTURE (FIG. 3) | | | PENTA-LAYERED STRUCTURE (FIG. 4) | TRI-LAYERED STRUCTURE (FIG. 1) |
| --- | --- | --- | --- | --- | --- |
| av. Mg conc. (wt. %) | 3 | 5 | 7 | 7 | 7 |
| time (hrs.) until formation of rust | 770 | 890 | 1010 | 1100 | 1010 |
| powdering (g/m$^2$) | 0.20 | 0.29 | 0.37 | 0.46 | 0.25 |
| number of spots capable of continuous welding | 1150 | 1200 | 1200 | 1200 | 1200 |
| difference ($\Delta L^*$) in brightness representing blackening | −3 | −3 | −4 | −3 | −3 |

Comparative Example 1

The same parent sheet was heated at 120° C., and a Zn-Mg alloy coating layer having the homogeneous composition was formed with an adhesion amount of 100 g/m$^2$ per single face by the simultaneous deposition of Zn and Mg.

Comparative Example 2

Vapor deposition in the order of Zn→Mg was performed on the same parent sheet held at 200° C., and then the parent sheet was heated at 270°–330° C. The coating layer formed in this way had the bi-layered structure comprising an under sublayer composed of a Zn-Mg alloy containing 0.5 wt. % or less Mg and an upper sublayer composed of a Zn-Mg alloy containing 10 wt. % or more Mg. In this case, an adhesion amount was controlled at 100 g/m$^2$ per single face (corresponding to the thickness of approximately 0.2 μm), and the temperature of the parent sheet was controlled so as to form a Zn-Fe or Zn-Fe-Mg alloy layer at the boundary between the substrate steel and the coating layer.

Comparative Example 3

Vapor deposition in the order of Mg→Zn was performed on the same steel sheet with an adhesion amount of 100 g/m$^2$ per single face, and the steel sheet was heated at 270°–330° C. so as to form a Zn-Mg alloy coating layer having the bi-layered structure comprising an upper sublayer having Mg concentration of approximately 10 wt. % or less and an upper sublayer having Mg concentration of 0.5 wt. % or more.

Comparative Example 4

The same steel sheet held at 90° C. was subjected to vapor deposition in the order of Zn deposition→simultaneous Zn and Mg depositions→Zn deposition. The coating layer formed in this way had the tri-layered structure comprising an under Zn sublayer, a middle sublayer composed of a Zn-Mg alloy having Mg concentration of approximately 10 wt. % and an upper Zn sublayer. In this case, an adhesion amount was adjusted to 100 g/m$^2$ per single face.

Each coated steel sheet was acid pickled 10 minutes in a 0.5%-HCl solution to remove Mg-rich layers from the surface and then sufficiently washed with water. The coated steel sheets were examined by the same way to research the properties of the coating layers. The results are shown in Table 2.

TABLE 2

PROPERTIES OF COATING LAYERS IN RELATION WITH MULTI-LAYERED STRUCTURE (COMPARATIVE EXAMPLE)

| NO. OF COMPARATIVE EXAMPLE STRUCTURE OF COATING LAYER | 1 HOMOGENEOUS Mg. CONC. | 2 HOMOGENEOUS Mg. CONC. | 3 BI-LAYERED STRUCTURE | 3 BI-LAYERED STRUCTURE | 4 TRI-LAYERED STRUCTURE |
| --- | --- | --- | --- | --- | --- |
| av. Mg conc. (wt. %) | 5 | 7 | 7 | 7 | 7 |
| time (hrs.) until formation of rust | 790 | 890 | 1010 | 940 | 670 |
| powdering (g/m$^2$) | 10.8 | 19.3 | 0.21 | 3.35 | 0.15 |
| number of spots capable of continuous welding | 600 | 550 | 400 | 1200 | 1200 |
| difference ($\Delta L^*$) in brightness representing blackening | −15 | −19 | −25 | −3 | −3 |

It is noted from Table 2 that the coated steel sheet in any of the comparative examples was inferior in corrosion resistance, anti-powdering, spot weldability and anti-blackening. Especially, the coated steel sheets in the comparative examples 1 and 2 having high Mg concentration even at the surface showed big difference ($\Delta L^*$) in brightness and did not keep good external appearance. The coated steel sheet in the comparative example 3 caused too much powdering and was inferior in workability, although Mg concentration was lower at the surface.

Example 2
Steps of Manufacturing Coated Steel Sheet

An Al-killed steel sheet of 0.7 mm in thickness having the composition of 0.003 wt. % C, 0.03 wt. % Si, 0.29 wt. % Mn, 0.009 wt. % P, 0.002 wt. % S, 0.03 wt. % Ti, 0.035 wt. % Al and the balance Fe was used as a parent sheet. After this parent sheet was reductively heated in the same way as that in Example 1, it was carried into the vacuum chamber held in a $N_2$ atmosphere at the degree of vacuum $5 \times 10^{-2}$ torr.

In the vacuum chamber, vapor deposition in the order of Zn→Mg→Zn was performed with an adhesion amount of 20 g/m² per single face. After the vapor deposition, the steel sheet was heated at 270°–350° C. The coated steel sheet obtained in this way had a coating layer whose Mg concentration was 5 wt. % in average. The coating layer had the multi-layered structure shown in FIG. 3 or 4, and a Zn-Fe or Zn-Fe-Mg alloy layer of 0.1–0.3 μm in thickness was formed at the boundary between the substrate steel and the coating layer. The highest-Mg sublayer had Mg concentration of approximately 11 wt. %, while the sublayers on and under said highest-Mg sublayer had Mg concentration of approximately 0.1 wt. %. The sublayers between the high-Mg and the low-Mg sublayers had Mg concentration of approximately 4 wt. %.

Each steel sheet coated with the Zn-Mg binary coating layer was acid pickled in a 0.5%-HCl solution to remove Mg-rich layers from the surface.

The coated steel sheets after the acid pickling was examined to research secondary paint adhesiveness and corrosion resistance.

Research for Secondary Paint Adhesiveness

After each coated steel sheet was pretreated by chromating or phosphating, a type-acryl electrodeposition coating of 20 μm in thickness as dried state was applied to the sheet. The painted steel sheet was dipped 1000 hrs. in distilled water at 50° C. and scratched with a cross cut pattern in the intervals of 1 mm by a cutter knife. An adhesive tape was applied onto the scratched surface and then peeled off. The parts of the coating layer separated from the surface of the test piece in the state stuck onto the adhesive tape were counted in number. The secondary paint adhesiveness was evaluated by the number of separated parts according to the standards shown in Table 3.

TABLE 3

STANDARDS FOR EVALUATION OF SECONDARY PAINT ADHESIVENESS

| REMARKS | RATIO OF SEPARATION BY SURFACE AREA |
| --- | --- |
| ◯ | ≦5% |
| Δ | 5–50% |
| × | >50% |

Research for Corrosion Resistance

Corrosion resistance was evaluated by a time period until the formation of rust in the salt water spray test regulated in JIS Z2371.

The effects of the adhesion amount of the top Zn-Mg alloy sublayer having Mg concentration of 5 wt. % or less in the coating layers having the tri-layered structure (shown in FIG. 3) and the penta-layered structure (shown in FIG. 4) on water-proof secondary paint adhesiveness are shown in Tables 4 and 5, respectively. It is noted from these Tables that sufficinet adhesiveness was obtained in the coating layer having any multi-layered structure, when the top sublayer was formed with an adhesion amount of 0.3 g/m² or more.

TABLE 4

SECONDARY PAINT ADHESIVENESS OF Zn—Mg COATING LAYER HAVING TRI-LAYERED STRUCTURE SHOWN IN FIG. 3

| ADHESION AMOUNT OF TOP SUBLAYER (g/m²) | PRETREATMENT FOR PAINTING | SECONDARY PAINT ADHESIVENESS |
| --- | --- | --- |
| 0.06 | A | × |
| 0.1 | A | Δ |
| 0.3 | A | ◯ |
| 0.6 | A | ◯ |
|  | B | ◯ |
| 1.1 | A | ◯ |
|  | B | ◯ |
| 2.0 | A | ◯ |
|  | B | ◯ |
| 3.3 | A | ◯ |
|  | B | ◯ |
| 4.6 | A | ◯ |
|  | B | ◯ |

NOTE: A is chromating, and B is phosphating.

TABLE 5

SECONDARY PAINT ADHESIVENESS OF Zn—Mg COATING LAYER HAVING PENTA-LAYERED STRUCTURE SHOWN IN FIG. 4

| ADHESION AMOUNT OF TOP SUBLAYER (g/m²) | PRETREATMENT FOR PAINTING | SECONDARY PAINT ADHESIVENESS |
| --- | --- | --- |
| 0.05 | A | × |
| 0.1 | A | Δ |
| 0.3 | A | ◯ |
| 0.7 | A | ◯ |
|  | B | ◯ |
| 1.3 | A | ◯ |
|  | B | ◯ |
| 2.0 | A | ◯ |
|  | B | ◯ |

NOTE: A is chromating, and B is phosphating.

The effects of the adhesion ratio of the first sublayer to the top sublayer on corrosion resistance are shown in Tables 6 and 7. In this case, the first and top sublayers were composed of a Zn-Mg alloy containing 0.5 wt. % or less Mg, and the top sublayer was formed with an adhesion amount of 0.3 g/m² or more. It is noted from these Tables that the time period until the formation of rust was prolonged in any coating layer having the tri-layered or penta-layered structure by controlling the adhesion ratio at 1.2 or more, resulting in good corrosion resistance.

TABLE 6

THE EFFECT OF ADHESION RATIO OF FIRST SUBLAYER TO TOP SUBLAYER ON CORROSION RESISTANCE IN COATING LAYER HAVING TRI-LAYERED STRUCTURE SHOWN IN FIG. 3

| ADHESION RATIO OF FIRST/TOP SUBLAYER | TIME (HRS.) UNTIL FORMATION OF 5% RUST IN SALT WATER SPRAY TEST |
| --- | --- |
| 0 | 120 |
| 0.5 | 120 |
| 1.0 | 120 |
| 1.2 | 132 |
| 1.9 | 148 |
| 3.3 | 156 |
| 4.1 | 156 |

TABLE 7

THE EFFECT OF ADHESION RATIO OF FIRST SUBLAYER TO TOP SUBLAYER ON CORROSION RESISTANCE IN COATING LAYER HAVING PENTA-LAYERED STRUCTURE SHOWN IN FIG. 4

| ADHESION RATIO OF FIRST/TOP SUBLAYER | TIME (HRS.) UNTIL FORMATION OF 5% RUST IN SALT WATER SPRAY TEST |
|---|---|
| 0 | 132 |
| 0.4 | 132 |
| 0.9 | 132 |
| 1.2 | 144 |
| 1.8 | 150 |
| 2.6 | 162 |

Example 3
Steps of Manufacturing Coated Steel Sheet

A steel sheet of 0.5 mm in thickness having the composition of 0.005 wt. % C, 0.04 wt. % Si, 0.33 wt. % Mn, 0.008 wt. % P, 0.003 wt. % S, 0.04 wt. % Ti, 0.046 wt. % Al and the balance Fe was used as a parent sheet. This parent sheet was reductively heated by the same way as that in Example 1 and then fed into the vacuum chamber held in a $N_2$ atmosphere with the degree of vacuum $5 \times 10^{-2}$ torr.

Vacuum deposition in the order of Zn→Mg→Zn was performed in this vacuum chamber. In this example, an adhesion amount in total was adjusted to 30 g/m² per single face by controlling first Zn deposition at 17 g/m², Mg deposition at 1 g/m² and secondary Zn deposition at 12 g/m². The temperature of the parent sheet before the vapor deposition was controlled such that the temperature of the steel sheet after the completion of vapor deposition was within the range of 270°–370° C. The heat retained in the steel sheet effectively promoted mutual diffusion between Zn and Mg. In the case of forming the coating layer having the penta-layered structure shown in FIG. 4, the steel sheet after the completion of vapor deposition was controlled at 345°–370° C.

A Zn-Fe or Zn-Fe-Mg alloy layer of 0.01–0.1 μm in thickness was formed by the temperature control, and a Zn-Mg binary coating layer having the tri-layered structure (shown in FIG. 3) or the penta-layered structure (shown in FIG. 4) was formed on the Zn-Fe or Zn-Fe-Mg alloy layer.

The second sublayer in FIG. 3 and the third sublayer in FIG. 4 had Mg concentration of approximately 12 wt. % and the mixed structure of a $Zn_2Mg$ phase with a Mg-dissolved Zn phase as shown in FIG. 5. The top sublayer (i.e. the third sublayer in FIG. 3 or the fifth sublayer in FIG. 4) and the first sublayer (in FIG. 3 or 4) had Mg concentration of approximately 0.1 wt. %. The second and forth sublayers in FIG. 4 had Mg concentration of approximately 5 wt. % and the mixed structure of a $Zn_{11}Mg_2$ phase with a Mg-dissolved Zn phase.

The coating layer having the tri-layered structure shown in FIG. 3 comprised the first sublayer of 2.5 μm in thickness, the second sublayer of 0.8 μm in thickness and the third sublayer of 1 μm in thickness. The coating layer having the penta-layered structure shown in FIG. 4 comprised the first sublayer of 2.3 μm in thickness, the second sublayer of 0.2 μm in thickness, the third sublayer of 1 μm in thickness, the forth sublayer of 0.2 μm in thickness and the fifth sublayer of 0.8 μm in thickness.

In addition, after vapor deposition was performed under the condition that the temperature of the steel sheet was at 230° C. at the completion of the vapor deposition, the steel sheet was heated 5 hrs. at 150°–240° C. in a $N_2$ atmosphere to accelerate mutual diffusion between Zn and Mg. The Zn-Mg binary coating layer having the tri-layered structure (FIG. 3) or the penta-layered structure (FIG. 4) was formed by said heat treatment, too. In this case, the heating temperature was predetermined within the range of 160°–180° C. for the tri-layered structure or within the range of 200°–220° C. for the penta-layered structure.

Figure 7:
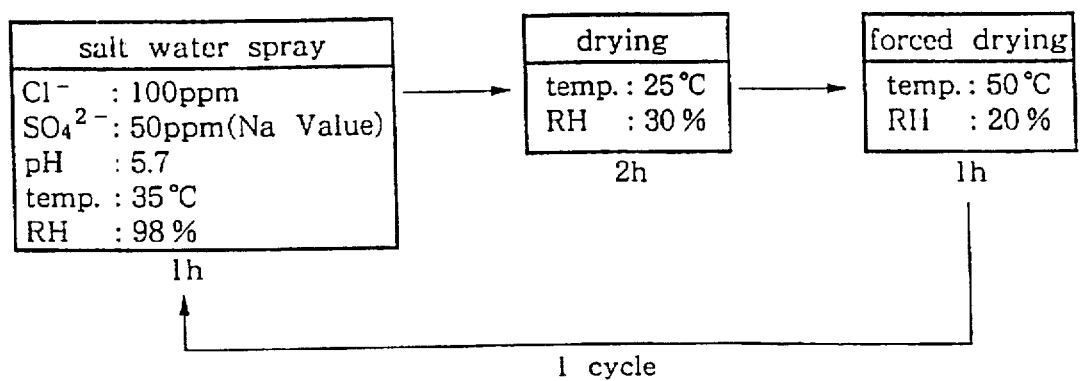
FIG. 7 is a flow chart illustrating a complexed cycle corrosion test.

Each coated steel sheet obtained in this way was covered with a Mg-rich layer. Since the Mg-segregated layer would cause blackening, it was removed by a 0.5%-HCl solution.
Research for Corrosion Resistance A test piece having the dimensions of 100 mm×200 mm was cut out from the each steel sheet coated with the Zn-Mg binary coating layer and offered to the complexed cycle corrosion test shown in FIG. 7. This corrosion test imitates an outdoor corrosive atmosphere and is likely to form rust at cut end faces.

As for a comparative example 5, a steel sheet coated with a Zn-Mg alloy layer in the same adhesion amount of 30 g/m² as that in Example 3 shown in FIG. 3 or 4 was manufactured by the vapor deposition in the order of Zn deposition→simultaneous Zn and Mg deposition→Zn deposition. In this case, the Mg deposition was adjusted to the same amount of 1 g/m² as that in Example 3. The relation of each sublayer in thickness and the concentration were controlled at the same levels as those in Example 3, too. The middle sublayer in the coating layer obtained in this way had the mixed structure of a $Zn_2Mg$ phase with a $Zn_{11}Mg_2$ phase, but the presence of a Mg-dissolved Zn phase was not detected.

A vapor Zn-coated steel sheet in an adhesion amount of 30 g/m² was manufatured as a comparative example 6.

A test piece cut out from each coated steel sheet was examined by the corrosion test to research corrosion resistance at a cut end face. The results are shown in Table 8. It is noted from Table 8 that any steel sheet coated with the Zn-Mg binary coating layer according to the present invention endured over a long time until the formation of rust at the cut end face as compared with the comparative example 5. The long endurance time means the excellent corrosion resistance of the coated steel sheet according to the present invention. The excellent corrosion resistance is supposed to be derived from the formation of the Zn-12% Mg sublayer having the mixed structure of the $Zn_2Mg$ phase with the Mg-dissolved Zn phase. On the contrary, in the case of the test piece of the comparative Example 5 coated with a coating layer having a Zn-12% Mg intermediate sublayer composed of the mixed structure of the $Zn_2Mg$ phase with the $Zn_{11}Mg_2$ phase, rust was detected at the cut end face after 13 cycles of the corrosion test at the longest.

The coated steel sheet according to the present invention had a Zn-Fe or Zn-Fe-Mg alloy layer formed at the boundary between the substrate steel and the Zn-Mg binary coating layer effective in adhesiveness. For instance, the peeling of the coating layer was not detected at all, by the test wherein the coated steel sheet was bent with 0t (i.e. the coated sheet was bent with the angle of 180 degrees without the insertion of any sheet), an adhesive tape was applied onto the bent part and then the adhesive tape was peeled off the surface.

TABLE 8

CORROSION RESISTANCE OF COATED STEEL SHEET AT CUT END FACE

| KIND OF COATING LAYER | STEP OF VAPOR DEPOSITION | DIFFUSION OF Zn AND Mg | STRUCTURE OF INTER-MEDIATE LAYER [SECOND LAYER IN FIG. 3 AND THIRD LAYER IN FIG. 4] | LAMELLAR STRUCTURE OF COATING LAYER | REPETITION CYCLE NOS. UNTIL RUST FORMATION AT CUT END FACE | NOTE |
|---|---|---|---|---|---|---|
| Zn—Mg alloy | Zn deposition ↓ | diffusion by heat | mixed structure of $Zn_2Mg$ phase with Mg dissolved Zn phase | FIG. 3 | 25 | examples of the present invention |
|  | Mg deposition ↓ | retained in steel sheet | dissolved Zn phase | FIG. 4 | 45 |  |
|  | Zn deposition | heating 5 hrs. in $N_2$ atmosphere | mixed structure of $Zn_2Mg$ phase with Mg dissolved Zn phase | FIG. 3 | 25 |  |
|  |  |  |  | FIG. 4 | 45 |  |
|  | Zn deposition → simultaneous Zn and Mg deposition → Zn deposition | — | mixed structure of $Zn_3Mg$ phase with $Zn_{11}Mg_2$ phase | FIG. 3 | 10 | comparative example 5 |
|  |  |  |  | FIG. 4 | 13 |  |
| Zn | Zn deposition | — | — | single Zn phase | 5 | comparative example 6 |

Example 4

Steps of Manufacturing of Coated Steel Sheet

An unannealed cold-rolled steel sheet of 1.0 mm in thickness and 918 mm in width having the composition of 0.023 wt. % C, 0.24 wt. % Si, 0.24 wt. % Mn, 0.013 wt. % P, 0.007 wt. % S, 0.019 wt. % Al and the balance Fe was used as a parent sheet. This parent sheet was processed in the plant whose layout is shown in FIG. 6, to manufacture a steel sheet coated with a vapor Zn-Mg binary layer.

A duct 20 was held in a $N_2$ atmosphere having $O_2$ concentration of 0.001 vol. % and $H_2O$ concentration of 0.06 vol. %. The time period of the parent sheet 1 passing through the duct 20 was predetermined at 70 seconds. The temperature of the parent sheet 1 was controlled so that the steel sheet was held at a predetermined temperature when entering into each of the primary Zn deposition compartment 40 and the first Zn deposition compartment 60. In this case, since the steel sheet was slightly heated by vapor deposition, the temperature of the steel sheet was adjusted lower by 10° C. or less compared with the predetermined value in response to the rising of the temperature during the vapor deposition. The deposition amounts in the first Zn deposition compartment 60 and the second Zn deposition compartment 70 were predetermined at 10 g/m² per single face. The steel sheet 4 after the vapor deposition was carried into a high-frequency heating furnace 80 and then heated 5 seconds at 310° C. in a $N_2$ atmosphere.

Research for Effects of Primary Zn Deposition, Mg Deposition and Temperature of Steel Sheet on Adhesiveness and Structure The amount of primary Zn deposition, the amount of Mg deposition and the temperature of the steel sheet during vapor deposition were variously changed to research those effects on the adhesiveness and structure of a formed coating layer. The adhesiveness was examined by the same bending-peeling test as that in Example 4, and evaluated as good when the peeling of the coating layer was not detected at all. The structure of the coating layer was testified by observing the section of the coating layer with SEM, and its density was researched. The results are shown in Table 9.

It is noted from Table 9 that a Zn-Mg binary layer having dense structure excellent in adhesiveness was formed, when primary Zn was deposited on the steel sheet held at 180° C. or higher with a deposition amount equal to 1.5 times that of Mg deposition.

On the contrary, the partial or wholly peeling of the coating layer was detected in the coated steel sheet when the deposition ratio of primary Zn to Mg was less than 1.5. That is, the lower deposition ratio causes poor adhesiveness. The coating layer was partially peeled off, when the coated steel sheet was manufactured with the adhesion ratio below 1.5 without the heat treatment. When the temperature of the steel sheet was below 180° C. during vapor deposition, vacancies were observed in the formed coating layer, although the coating layer was good of adhesiveness. These results means that the adhesion ratio of primary Zn to Mg and the temperature of the steel sheet played important roles in the improvement of adhesiveness and dense structure.

TABLE 9

EFFECTS OF PRIMARY Zn DEPOSITION AND TEMPERATURE OF STEEL SHEET ON ADHESIVENESS AND STRUCTURE OF COATING LAYER

| AMOUNT OF PRIMARY Zn DEPOSITION (g/m²) | AMOUNT OF Mg DEPOSITION (g/m²) | DEPOSITION RATIO OF PRIMARY Zn TO Mg | TEMP. OF STEEL SHEET DURING VAPOR DEPOSITION (°C.) | EVALUATION OF COATING LAYER | | NOTE |
|---|---|---|---|---|---|---|
| | | | | ADHESIVENESS | STRUCTURE | |
| 0.9 | 0.5 | 1.8 | 220 | good | dense | examples |
| 2.2 | 0.5 | 4.4 | 220 | good | dense | of the |

TABLE 9-continued

EFFECTS OF PRIMARY Zn DEPOSITION AND TEMPERATURE OF STEEL SHEET ON ADHESIVENESS AND STRUCTURE OF COATING LAYER

| AMOUNT OF PRIMARY Zn DEPOSITION ($g/m^2$) | AMOUNT OF Mg DEPOSITION ($g/m^2$) | DEPOSITION RATIO OF PRIMARY Zn TO Mg | TEMP. OF STEEL SHEET DURING VAPOR DEPOSITION (°C.) | EVALUTATION OF COATING LAYER ADHESIVENESS | STRUCTURE | NOTE |
|---|---|---|---|---|---|---|
| 5.7 | 0.5 | 11.4 | 220 | good | dense | present |
| 1.8 | 1.2 | 1.5 | 220 | good | dense | inven- |
| 2.9 | 1.2 | 2.4 | 220 | good | dense | tion |
| 5.2 | 1.2 | 4.3 | 220 | good | dense | |
| 8.3 | 1.2 | 6.9 | 220 | good | dense | |
| 2.2 | 0.5 | 4.4 | 180 | good | dense | |
| 8.3 | 1.2 | 6.9 | 180 | good | dense | |
| 0.8 | 1.2 | 0.7 | 220 | peeled*1 | dense | compara- |
| 1.5 | 1.2 | 1.3 | 220 | peeled*2 | dense | tive |
| 2.2 | 0.5 | 4.4 | 150 | good | vacancies | examples |
| 8.3 | 1.2 | 6.9 | 160 | good | vacancies | |

NOTE 1: The coating layer was completely peeled off.
NOTE 2: The coating layer was partially peeled off.

Example 5

$O_2$ concentration X (vol. %) and $H_2O$ concentration Y (vol. %) of an atmosphere in the duct 20 were variously changed together with a time period (seconds) for passing a steel sheet though the duct 20 and an amount of $H_2$ added to the atmosphere, to research those effects on the adhesiveness of a formed coating layer. In this example, a deposition amount of primary Zn was predetermined at 5 $g/m^2$, a deposition amount of Mg was predetermined at 1.2 $g/m^2$, and the temperature of the steel sheet during vapor deposition was adjusted to 250° C. The steel sheet 4 after the vapor deposition was heat treated at 300° C. in the high-frequency heating furnace 80 held in a $N_2$ atmosphere.

The results are shown in Tables 10 and 11. It is noted from Table 10 that a coating layer was formed with good adhesiveness under the conditions satisfying the relationships of X×Z≦1.2 and Y×Z≦35. On the other hand, the adhesiveness was inferior, if any one of the relationships of X×Z≦1.2 and Y×Z≦35 was not satisfied, as shown in Table 11.

In the case when $H_2$ was added to the atmosphere in the duct, good adhesiveness was obtained under the conditions of X×Z≦3.8 and Y×Z≦80. On the other hand, the adhesiveness was inferior, if any one of the relationships of X×Z≦3.8 and Y×Z≦80 was not satisfied. The effect of $H_2$ to relax the condition of the atmosphere was apparent, when $H_2$ was added in an amount of $H_2$ was 0.05 vol. % or more.

TABLE 10

EFFECTS OF $O_2$ AND $H_2O$ CONCENTRATION OF ATMOSPHERE IN DUCT AND PASS TIME OF STEEL SHEET ON ADHESIVENESS OF COATING LAYER (PRESENT INVENTION)

| X × Z (vol. % · sec.) | Y × Z (vol. % · sec.) | ADDITION AMOUNT OF $H_2$ (vol. %) | ADHESIVENESS OF COATING LAYER |
|---|---|---|---|
| 0.01 | 5.3 | 0 | good |
| 0.07 | 5.0 | 0 | good |
| 0.2 | 5.5 | 0 | good |
| 0.5 | 5.5 | 0 | good |
| 1.2 | 5.2 | 0 | good |
| 1.0 | 8.5 | 0 | good |
| 0.5 | 15.8 | 0 | good |
| 1.2 | 25.3 | 0 | good |
| 1.2 | 34.1 | 0 | good |
| 1.5 | 25.3 | 0.1 | good |
| 3.2 | 25.3 | 0.5 | good |
| 3.2 | 55.0 | 1.5 | good |
| 3.2 | 78.9 | 1.5 | good |
| 3.8 | 78.9 | 4.0 | good |

TABLE 11

EFFECTS OF $O_2$ AND $H_2O$ CONCENTRATION OF ATMOSPHERE IN DUCT AND PASS TIME OF STEEL SHEET ON ADHESIVENESS OF COATING LAYER (COMPARATIVE EXAMPLE)

| X × Z (vol. % · sec.) | Y × Z (vol. % · sec.) | ADDITION AMOUNT OF $H_2$ (vol. %) | ADHESIVENESS OF COATING LAYER |
|---|---|---|---|
| 1.6 | 8.5 | 0 | completely peeled |
| 1.0 | 39.2 | 0 | completely peeled |
| 1.6 | 37.2 | 0 | completely peeled |
| 4.3 | 25.3 | 0.5 | partially peeled |
| 1.5 | 85.4 | 1.5 | partially peeled |
| 4.3 | 85.4 | 4.0 | completely peeled |
| 3.2 | 25.3 | 0.01 | completely peeled |

According to the present invention as afore-mentioned, the formed Zn-Mg binary coating layer has the structure that a ductile low-Mg sublayer is interposed between substrate steel and a high-Mg sublayer. Due to this specified structure, the high-Mg sublayer effectively protects the coated steel sheet against corrosion, while the low-Mg sublayer effectively absorbs the difference in deformation between the hard high-Mg sublayer and the substrate steel during working the coated steel sheet.

The harmful influence of the high-Mg sublayer on waterproof secondary paint adhesiveness is suppressed by forming the top sublayer composed of a Zn-Mg alloy having Mg concentration of 0.5 wt. % or less with an adhesion amount of 0.3 g/m² or more. Regardless the formation of the top low-Mg sublayer, the intrinsic properties of the high-Mg sublayer are well exhibited to assure superior corrosion resistance.

Consequently, the coated steel sheet according to the present invention is excellent in workability as well as corrosion resistance due to the high-Mg sublayer. In addition, since Mg concentration on the surface is lowered, the coated steel sheet is improved in spot weldability, too. The coated steel sheet has the feature that secondary paint adhesiveness is well balanced with the high corrosion resistance, so that it is useful as structural members or parts exposed to a severe corrosive atmosphere in various industrial fields.

The adhesiveness of the coating layer is improved by vapor depositing primary Zn before vapor Mg deposition with the adhesion ratio of 1.5 times Mg deposition or more, when the coated steel sheet is manufactured by vapor deposition process. The primary Zn deposition is effective for inhibiting a brittle intermediate layer at the boundary between the substrate steel and the coating layer, too. The adhesiveness of the coating layer is also improved by controlling the composition of an atmosphere leading to a vacuum chamber so as to inhibit the re-oxidation of the steel surface activated by reductive heating.

What is claimed is:

1. A method of manufacturing a steel sheet coated with a Zn-Mg layer having one of a tri-layered or penta-layered structure comprising a first sublayer including a Zn-Mg alloy having a Mg concentration of about 0.5 wt. % or less, an intermediate sublayer including a Zn-Mg alloy having a Mg concentration of about 7 wt. % or more and an outermost sublayer including a Zn-Mg alloy having a Mg concentration of about 0.5 wt.% or less, wherein the sublayers are successively laminated on a substrate steel wherein a Zn-Fe or Zn-Fe-Mg alloy layer is formed at a boundary between the substrate steel and the Zn-Mg coating layer, said method comprising the steps of:

vapor depositing primary Zn on a surface of a steel sheet; and successively vapor depositing Mg and Zn on said surface, wherein a ratio of said primary Zn deposition to said Mg deposition is controlled to a value of about 1.5 or more.

2. The manufacturing method according to claim 1, wherein the steel sheet is held at a temperature of about 180° C. or higher during vapor deposition.

3. A method of manufacturing a steel sheet coated with a Zn-Mg Layer, having one of a tri-layered or penta-layered structure comprising a first sublayer including a Zn-Mg alloy having a Mg concentration of about 0.5 wt. % or less, an intermediate sublayer including a Zn-Mg alloy having a Mg concentration of about 7 wt. % or more and an outermost sublayer including a Zn-Mg alloy having a Mg concentration of about 0.5 wt. % or less, wherein the sublayers are successively laminated on a substrate steel wherein a Zn-Fe or Zn-Fe-Mg alloy layer is formed at a boundary between the substrate steel and the Zn-Mg coating layer, said method comprising the steps of:

carrying a steel sheet having a surface activated by reductive heating through a reducing atmosphere, a chamber held in a $N_2$ atmosphere, a duct held in a $N_2$ atmosphere and inlet sealing rolls into a vacuum chamber; and successively vapor depositing primary Zn, Mg and Zn on the surface of said steel sheet, wherein said steel sheet is passed through said duct under conditions satisfying the relationships of $X \times Z \geq 1.2$ and $Y \times Z \geq 35$, wherein X represents a vol. % $O_2$ concentration of the atmosphere in said duct, Y represents a vol. % $H_2O$ concentration of the atmosphere in said duct, and Z represents the time period of said steel sheet passing through said duct.

4. The manufacturing method defined in claim 3, wherein $H_2$ is added to the atmosphere in the duct.

5. The manufacturing method defined in claim 4, wherein the steel sheet is passed through the duct held in the atmosphere to which $H_2$ is added in an amount of 0.05–4 vol. % under the conditions satisfying the relationships of $X \times Z \leq 3.8$ and $Y \times Z \leq 80$.

6. A method of manufacturing a steel sheet coated with a Zn-Mg layer having one of a tri-layered or penta-layered structure comprising a first sublayer including a Zn-Mg alloy having a Mg concentration of about 0.5 wt. % or less, an intermediate sublayer including a Zn-Mg alloy having a Mg concentration of about 7 wt. % or more and an outermost sublayer including a Zn-Mg alloy having a Mg concentration of about 0.5 wt. % or less, wherein the sublayers are successively laminated on a substrate steel wherein a Zn-Fe or Zn-Fe-Mg alloy layer is formed at a boundary between the substrate steel and the Zn-Mg coating layer, said method comprising the steps of:

successively vapor depositing Zn, Mg and then Zn on a surface of a steel sheet; and controlling the temperature of said steel sheet within the range of about 270°–370° C. at a completion of vapor deposition, whereby the coating layer is conditioned to one of the tri-layered or penta-layered structure by the mutual diffusion between Mg and Zn.

7. A method of manufacturing a steel sheet coated with a Zn-Mg layer having one of a tri-layered or penta-layered structure comprising a first sublayer including a Zn-Mg alloy having a Mg concentration of about 0.5 wt. % or less, an intermediate sublayer including a Zn-Mg alloy having a Mg concentration of about 7 wt. % or more and an outermost sublayer including a Zn-Mg alloy having a Mg concentration of about 0.5 wt. % or less, wherein the sublayers are successively laminated on a substrate steel wherein a Zn-Fe or Zn-Fe-Mg alloy layer is formed at a boundary between the substrate steel and the Zn-Mg coating layer, said method comprising the steps of:

successively vapor depositing Zn, Mg and then Zn on a surface of a steel sheet; and heating said steel sheet about 1 hr. or longer at about 150°–240° C. after the completion of vapor deposition, whereby the coating layer is conditioned to one of the tri-layered or penta-layered structure by the mutual diffusion between Mg and Zn.

* * * * *

UNITED STATES PATENT AND TRADEMARK OFFICE
CERTIFICATE OF CORRECTION

PATENT NO. : 5,747,111
DATED : May 5, 1998
INVENTOR(S) : Yasushi Fukui et al.

It is certified that error appears in the above-identified patent and that said Letters Patent is hereby corrected as shown below:

Title Page, under [56] References Cited, insert:
--U.S. PATENT DOCUMENTS
3,505,042  4/1970  Sievant et al.  428/659
5,135,817  8/1992  Shimoseri       428/659
5,283,131  2/1994  Mori            428/659--.

Title Page, under [56] References Cited, FOREIGN PATENT DOCUMENTS, insert:
--64-17853  1/1989  Japan
  64-25990  1/1989  Japan
  2141588   5/1990  Japan--.

Title Page, under [56] References Cited, OTHER PUBLICATIONS, insert:
--Masayasu Maeda, et al., *Development of Zinc Vapor Deposited Steel Strip*, Nisshin Tec. Review No. 56 (1987), pp. 41-49 (With an English Synopsis)--.

Title Page, [57] ABSTRACT, line 18, "is sufficiently" should read --are sufficiently--.

Column 1 Line 50 "defects acts" should read --defects act--.

Column 2 Line 15 between "chamber" and "Zn" delete period and insert comma --,--.

Column 2 Line 31 "sheet sheet" should read --steel sheet--.

Column 5 Line 61 "ZnCl$_2$.4" should read --ZnCl$_2$•4--.

Column 5 Line 66 "Mg sublayers, sublayers." should read --Mg sublayers.--.

UNITED STATES PATENT AND TRADEMARK OFFICE
CERTIFICATE OF CORRECTION

PATENT NO. : 5,747,111
DATED : May 5, 1998
INVENTOR(S) : Yasushi Fukui et al.

It is certified that error appears in the above-identified patent and that said Letters Patent is hereby corrected as shown below:

Column 6 Line 18 "Mg sublayer puts" should read --Mg sublayer put--.

Column 6 Line 28 "contolling" should read --controlling--.

Column 7 Line 36 after "thickness" delete colon and insert semicolon --;--.

Column 7 Line 56 "depostion" should read --deposition--.

Column 8 Line 39 "is prevented" should read --are prevented--.

Column 9 Line 51 after "Ti" delete period and insert comma --,--.

Column 9 Line 57 "torr," should read --torr.--.

Column 10 Line 16 after "10 wt. %" delete period and insert comma --,--.

Column 12 TABLE 2 , column heading "2" should be moved to the right so that "2" and "3" are over "Bi-Layered Structure".

Column 13 Line 34 "as dried" should read --as in the dried--.

Column 13 Line 47 TABLE 3, column heading "EVALUIATION" should read --EVALUATION--.

Column 13 Line 65 "sufficinet" should read --sufficient--.

Column 15 Line 20 after "0.005 wt. % C" delete period and insert comma --,--.

UNITED STATES PATENT AND TRADEMARK OFFICE
CERTIFICATE OF CORRECTION

PATENT NO.  : 5,747,111
DATED       : May 5, 1998
INVENTOR(S) : Yasushi Fukui et al.

It is certified that error appears in the above-identified patent and that said Letters Patent is hereby corrected as shown below:

Column 16 Line 36 "manufatured" should read --manufactured--.

Columns 17-18, TABLE 8, under column "STRUCTURE OF INTERMEDIATE LAYER": "$Zn_3Mg$" should read --$Zn_2Mg$--.

Column 18 Line 51 "results means" should read --results mean--.

Column 18 TABLE 9 fifth column heading and
Column 20 TABLE 9-continued, "EVALUTATION" should read
--EVALUATION--.

Column 19 Line 28 "though the duct" should read --through the duct--.

Claim 3 Column 21 Line 49 "Zn-Mg Layer" should read
--Zn-Mg layer--.

Claim 3 Column 22 Line 8 "X x Z ≥ 1.2" should read
--X x Z ≤ 1.2--.

Claim 3 Column 22 Line 8 "Y x Z = 35" should read
--Y x Z ≤ 35--.

Signed and Sealed this

Twenty-fourth Day of November, 1998

Attest:

BRUCE LEHMAN

*Attesting Officer*     *Commissioner of Patents and Trademarks*